United States Patent [19]

Fujiyasu et al.

[11] Patent Number: 4,662,981
[45] Date of Patent: May 5, 1987

[54] METHOD AND APPARATUS FOR FORMING CRYSTALLINE FILMS OF COMPOUNDS

[75] Inventors: Hiroshi Fujiyasu; Yoshiki Kurosawa; Masaru Kaneko, all of Shizuoka, Japan

[73] Assignee: Koito Seisakusho Co., Ltd., Tokyo, Japan

[21] Appl. No.: 582,476

[22] Filed: Feb. 22, 1984

[30] Foreign Application Priority Data

Feb. 23, 1983 [JP] Japan .................................. 58-30094

[51] Int. Cl.[4] ............................................. C30B 23/06
[52] U.S. Cl. .................................... 156/610; 148/175; 156/612; 156/614
[58] Field of Search ...................... 118/719, 729, 730; 148/174, 175; 156/610–614, DIG. 67, DIG. 70, DIG. 72, DIG. 77, DIG. 92, DIG. 110; 422/245, 247, 248

[56] References Cited

U.S. PATENT DOCUMENTS

| | | | |
|---|---|---|---|
| 2,799,600 | 7/1957 | Scott | 118/719 X |
| 3,012,904 | 12/1961 | Baer et al. | 118/719 X |
| 3,297,501 | 1/1967 | Reisman | 156/611 X |
| 3,690,846 | 9/1972 | Akai et al. | 156/611 |
| 3,790,404 | 2/1974 | Garnache et al. | 427/255.5 X |
| 3,925,118 | 12/1975 | Hollan | 118/729 X |
| 3,941,624 | 3/1976 | Cho | 252/62.3 GA X |
| 4,154,631 | 5/1979 | Schoolar | 156/612 X |
| 4,226,208 | 10/1980 | Nishida et al. | 118/719 X |
| 4,282,045 | 8/1981 | Jensen et al. | 148/175 X |
| 4,330,932 | 5/1982 | Morris et al. | 156/612 X |
| 4,528,062 | 7/1985 | Kleinhans et al. | 156/611 |

OTHER PUBLICATIONS

Esaki et al, "Semiconductor Superfine Structures by Computer-Controlled Molecular Beam Epitaxy", *Thin Solid Films*, 36 (1976) pp. 285–298.
Chang et al, "The Growth of a GaAs-GaAlAs Superlattice", *J. Vac. Sci. Tenchnol.* vol. 10, No. 1, Jan./Feb. 1973, pp. 11–16.
Nishizawa et al, "Properties of Sn-doped GaAs", *J. Appl. Phys.*, vol. 44, No. 4, Apr. 1973, pp. 1638–1645.
Surface Science 142 (1984) pp. 579–585, North-Holland, Amsterdam, "Optical and Electrical Properties of PbTe-$Pb_{1-}Sn$ Te Superlattices..." by H. Fujiyasu and A. Ishida.
The Second International Conference (YamaDa Conference) on Modulated Semiconductor Structures, Sep. 9–13, 1985, Kyoto, Japan pp. 310–321.

*Primary Examiner*—Barry S. Richman
*Assistant Examiner*—Michael S. Gzybowski
*Attorney, Agent, or Firm*—Browdy and Neimark

[57] ABSTRACT

Two or more crucibles containing different source materials to be vaporized are arranged concentrically, with their mouths open to a vapor chamber defined by an open top envelope within a vacuum housing. The vacuum housing is evacuated while the vapor chamber is held open. Then, with the vapor chamber closed, heat is applied to the crucibles as well as to the envelope to evaporate the source compounds within the crucibles. A substrate is held against the open top of the vapor chamber when the vapor pressure therein rises to a predetermined degree, thereby causing deposition of the vaporized source materials onto the substrate in the form of a crystalline compound film. As required, an impurity evaporator may also be provided within the vacuum housing for doping the compound film. The substrate having the crystalline compound film grown thereon may be moved from over the vapor chamber to a position over the impurity evaporator. As the impurity source is evaporated, the impurity can be controllably added to the compound film by vacuum evaporation.

8 Claims, 6 Drawing Figures

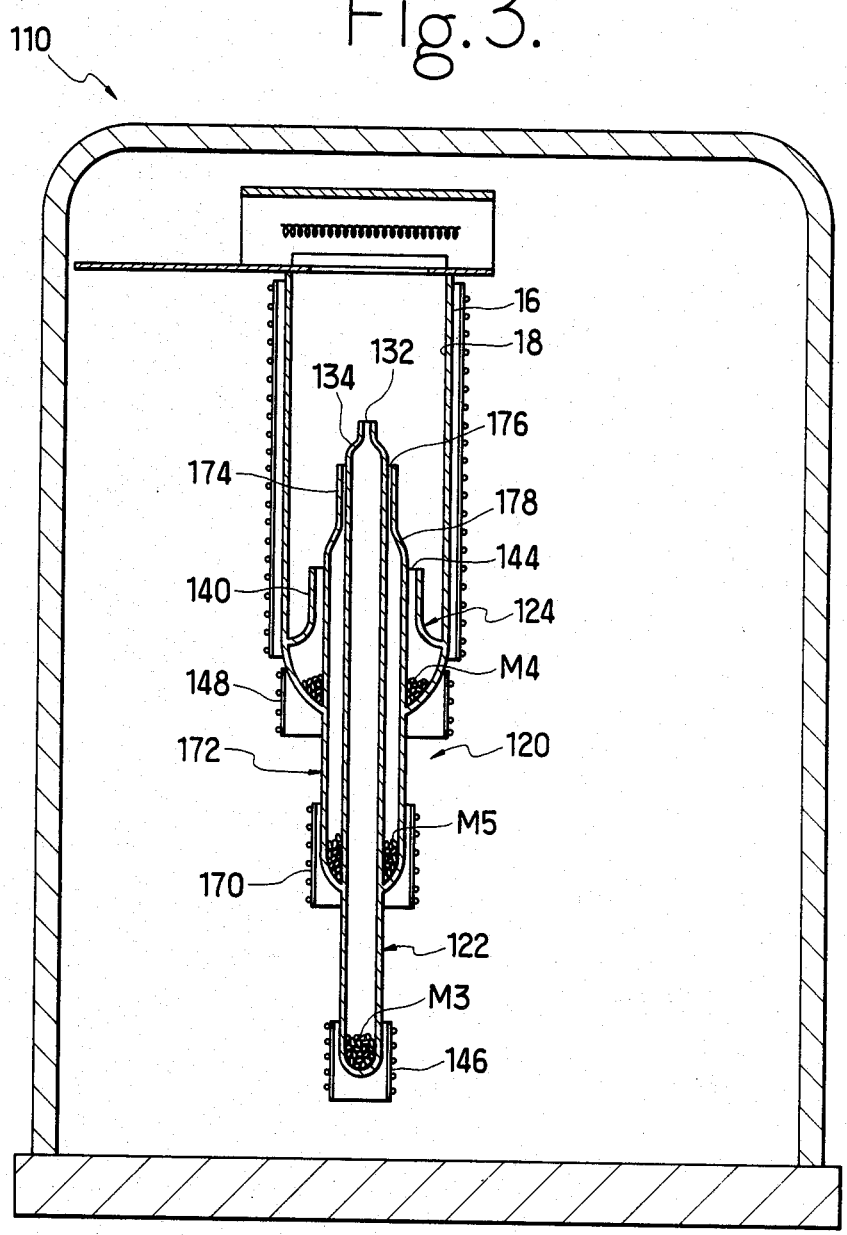

METHOD AND APPARATUS FOR FORMING CRYSTALLINE FILMS OF COMPOUNDS

BACKGROUND OF THE INVENTION

The present invention concerns formation of thin crystalline films of compounds and deals more specifically with a method of depositing high purity films of compounds such as zinc sulfide using desired substrates on a concept of what is termed "hot wall epitaxy".

Demands for thin films of compounds are ever increasing with the development of microelectronics and optical communication technology. Such films find use in a variety of devices for the conversion of electrical energy into light energy (e.g. semiconductor lasers, light emitting diodes, and electroluminescent lamps) and those for the conversion of light energy into electrical energy (e.g. infrared sensors and solar cells). All these devices require films of the highest purity and crystalline perfection. The addition of impurities to the films must also be well controlled.

We are aware of a great variety of methods heretofore suggested and practiced for the formation of crystalline compound films. The molecular beam method is perhaps the only one of such known methods that is capable of epitaxially growing the crystalline films of a diversity of compounds. This advantage is offset, however, by drawbacks such as (a) an extremely high degree of vacuum required, (b) bulky and expensive equipment, (c) considerable waste of the source materials, and (d) difficulties in the processing of large size substrates.

Liquid phase epitaxial growth is another well known method. The high temperatures required by this method, however, make it unapplicable to materials that develop high vapor pressures. It also involves difficulties in the processing of large size substrates. There also are various vapor phase methods of epitaxy, such as chemical vapor deposition, ALE, cathode sputtering, and vacuum evaporation. The disadvantages of these vapor phase methods are (a) high substrate temperatures, (b) limitations in the source materials that can be employed and in their possible combinations, and (c) the tendency of the deposited films to become amorphous.

Thus the prior art methods have all one drawback or another. We further wish to invite attention to the fact that molecular beam epitaxy has so far been probably the sole method capable of producing zinc sulfide films with high quality. As far as we are aware, the successful formation of zinc sulfide films by other methods has not been reported.

SUMMARY OF THE INVENTION

Our invention overcomes the listed problems of the prior art and makes possible the easy production of the high purity crystal films of various compounds, including zinc sulfide, by the use of simple and inexpensive equipment. Our invention also enables the addition of impurities in a well controlled manner.

Briefly stated in one aspect thereof, our invention provides a novel method of forming crystalline compound films by charging desired source materials into respective crucibles arranged concentrically in a vacuum chamber, with each crucible having a mouth open to an open top vapor chamber defined in the vacuum chamber. The vacuum chamber is evacuated with the vapor chamber held open. Then, with the vapor chamber closed, the source materials within the crucibles are evaporated by heating the crucibles. The vapor chamber is also heated during the evaporation of the crucibles. When the vapor pressure in the vapor chamber builds up to a prescribed degree, a substrate is held against the open top of the vapor chamber to cause deposition of a crystalline film of the desired compound thereon.

There is provided apparatus for use in carrying the above outlined method into practice which comprises a housing defining a vacuum chamber, an open top envelope disposed in the vacuum chamber and defining a vapor chamber, and a plurality of crucibles arranged concentrically in the vacuum chamber and each having a mouth open to the vapor chamber. The mouths of the crucibles are all at different distances from the open top of the envelope. The apparatus further comprises first and second means for heating the crucibles and the envelope respectively, a removable shutter for holding the open top of the envelope closed until the vapor pressure therein rises to the prescribed degree, and a substrate holder for holding a substrate against the open top of the envelope immediately upon removal of the shutter therefrom.

A preferred form of the envelope defining the vapor chamber is an upstanding tube. Further, in a preferred embodiment, the crucibles are concentric with the tubular envelope, with their mouths opened upwardly to the vapor chamber. The tubular wall bounding the vapor chamber is heated during the evaporation of the source materials within the crucibles and the epitaxial growth of a crystal film on the substrate. Hence the name, "hot wall epitaxy." The heated envelope serves the purpose of holding the vapors of the source compounds at a constant temperature and of efficiently diluting the vapors from the crucibles to the substrate. Further both the envelope and the crucibles are nearly pressure tightly closed during the preliminary vaporization of the source compounds and the growth of the film on the substrate, so that the escape of the vapors is minimized, and the vapor pressure is easy to control.

An additional feature of our invention resides in an impurity evaporator which also is disposed in the same vacuum chamber as the hot wall epitaxy system. The substrate being held by the substrate holder may be moved as required from over the vapor chamber envelope to a position over the impurity evaporator. The evaporation of the impurity source in the vacuum chamber makes possible the doping of the crystalline compound film by the vacuum evaporation process.

Among the advantages gained by our invention is that, despite the films of high purity and favorable crystallinity offered thereby, the invention requires much simpler equipment than does the prior art, notably the molecular beam method. The apparatus in accordance with the invention can, in fact, be a simple alteration of the known vacuum evaporation apparatus. Another advantage is that the invention demands no extraordinary degree of vacuum. The vacuum chamber may be evacuated to only $10^{-6}$ torr or so.

Still further our invention finds application to a wide variety of combinations of elements in addition to zinc and sulfur. Examples of such possible combinations are: (a) gallium and arsenic; (b) indium and antimony; (c) zinc and selenium; (d) zinc, sulfur and manganese; (e) palladium, tin and tellurium; and (f) mercury, cadmium and tellurium.

Listed below are additional advantages of our invention:

1. Large size substrates may be employed.
2. Source materials are hardly wasted.
3. Impurities can be added in a well controlled manner.
4. Laminar compound films are easy to produce.
5. Film growth can be monitored in process and easily controlled by temperature control, affording high reproducibility.
6. No posttreatment is necessary.
7. The vacuum system is little contaminated by use.
8. Substrate temperature need not be so high as required by some known methods.

The above and other features and advantages of our invention and the manner of realizing them will become more apparent, and the invention itself will best be understood, from a study of the following description and appended claims, with reference had to the attached drawings showing some preferred embodiments of the invention.

BRIEF DESCRIPTION OF THE DRAWINGS

FIG. 3 is a vertical section through another preferred form of the apparatus in accordance with the invention;

DETAILED DESCRIPTION OF THE INVENTION

For a better understanding of our invention we will first discuss the apparatus constructed to carry out the inventive method. The apparatus takes several different forms depending in part upon the number of elements to be compounded. We will disclose three different forms of the apparatus by way of example, followed by an example of the inventive method.

First Form

Figure 1:
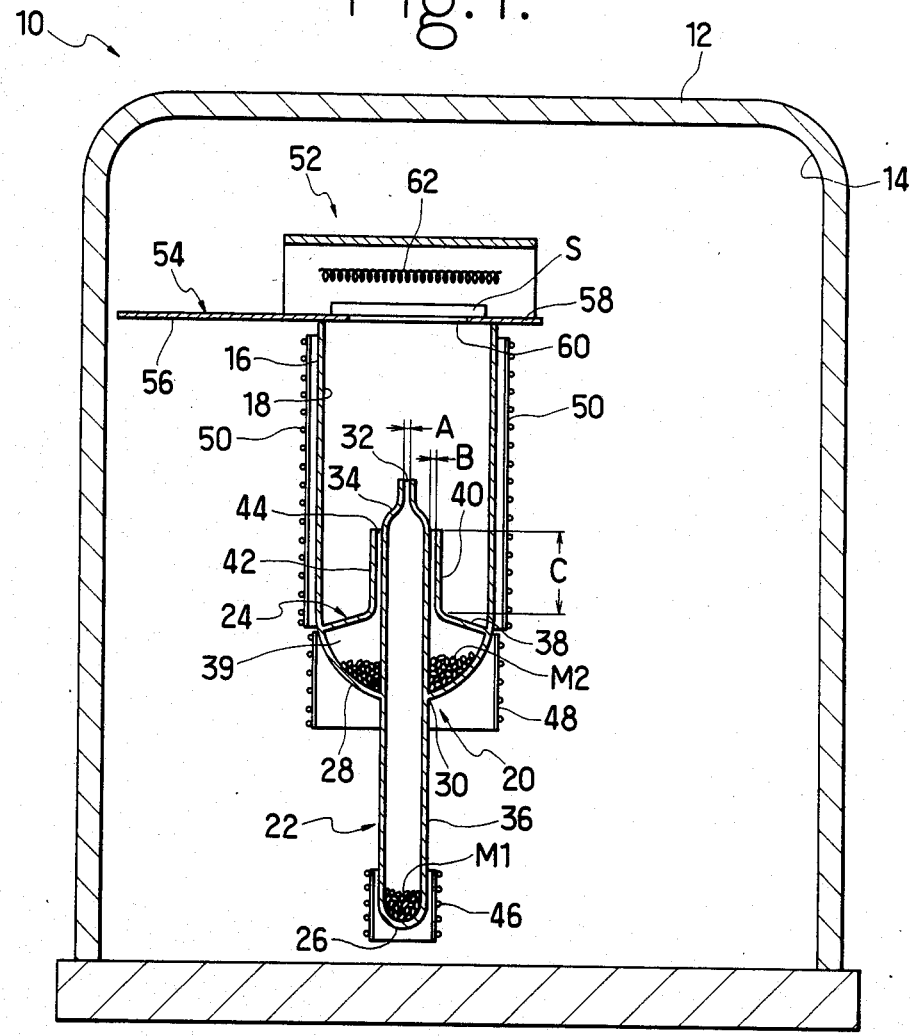
FIG. 1 is a vertical section through a preferred form of the apparatus for producing crystalline compound films in accordance with our invention.

FIG. 1 shows the apparatus as adapted for the fabrication of binary compound films. Generally designated 10, the exemplified apparatus has a hermetically sealed housing 12 defining a vacuum chamber 14. This vacuum chamber communicates with a vacuum pump, not shown, thereby to be evacuated. Disposed in the vacuum chamber 14 is an envelope 16 defining a vapor chamber 18. The vapor chamber envelope 16 takes the form of an upstanding tube, open at the top and closed at the bottom.

The reference numeral 20 generally denotes a crucible assembly comprising a center crucible 22 and an outer crucible 24 in this particular embodiment intended for the production of binary compound films. The two crucibles 22 and 24 are concentric with respect to each other and with the vapor chamber envelope 16. The center crucible 22 is tubular in shape, closed at its bottom end 26 and having a diameter considerably less than that of the vapor chamber envelope 16. This center crucible extends upwardly into the vapor chamber envelope 16 by passing through the center of the rounded bottom 28 of the envelope 16. The joint 30 between vapor chamber envelope 16 and center crucible 22 is pressure tightly closed. Formed at the top end of the center crucible 22 is a mouth 32 open to the vapor chamber 18. The center crucible mouth 32 is constricted, so that a shoulder 34 is formed between the mouth and major portion 36 of the center crucible. The center crucible 22 receives a source material M1 to be evaporated.

The outer crucible 24 comprises a frustoconical wall 38 arranged interiorly of the vapor chamber envelope 16 and coacting with its rounded bottom 28 to bound a space 39 for receiving another source material M2. The outer crucible 24 further comprises an upstanding, elongate neck 40 of reduced diameter surrounding part of the major portion 36 of the center crucible 22 with a slight spacing 42 therebetween. The constricted neck 40 provides at its top an annular mouth 44 surrounding the center crucible 22 and open to the vapor chamber 18. The outer crucible mouth 42 is positioned below the center crucible shoulder 34.

Quartz glass is a currently preferred material for the vapor chamber envelope 16 and the crucibles 22 and 24.

For vaporizing the source materials M1 and M2 within the crucibles 22 and 24 there are provided a heater 46 surrounding the bottom end portion of the center crucible 22, and another heater 48 surrounding the outer crucible 24. Still another heater 50 surrounds the vapor chamber envelope 16 for heating the same during the vaporization of the source materials M1 and M2 and the subsequent growth of a compound film.

Generally designated 52 is a shutter/holder combination comprising a plate member 54 slidable over the open top of the vapor chamber envelope 16. The plate member 54 has a shutter portion 56 and a substrate holder portion 58. Holding a substrate S thereon, the substrate holder portion 58 is apertured at 60 to expose the substrate to the vapor chamber 18. A substrate heater 62 is mounted above the substrate holder portion 58 for heating the substrate S during the growth of a compound film thereon. The shutter/holder combination 52 is coupled to a suitable actuator, not shown, thereby to be moved between a first position of FIG. 2A and a second position of FIG. 2B, with the plate member 54 in sliding contact with the open top of the vapor chamber envelope 16. When in the FIG. 2A position, the shutter/holder combination 52 closes the top of the vapor chamber envelope 16 with its shutter portion 56. On being moved to the FIG. 2B position the shutter/holder combination 52 places the substrate S atop the vapor chamber envelope 16. In this second position the substrate S is exposed to the vapor chamber 18 through the aperture 60 in the holder portion 58 of the plate member 54.

Operation of First Form

For the producing of a binary compound film by the apparatus 10 of FIG. 1, desired source materials may be charged separately into the two concentric crucibles 22 and 24. Then, with the shutter/holder combination 52 held in the FIG. 2A position, the crucibles 22 and 24, vapor chamber envelope 16 and substrate S may be heated by the respective heaters 46, 48, 50 and 62. The shutter/holder combination 52 may be shifted to the FIG. 2B position when the vapor pressure in the vapor chamber 18 builds up to a predetermined degree with the vaporization of the source materials M1 and M2. The vapors will then deposit on the exposed lower surface of the substrate S to form the desired crystalline film.

More specifically, for the production of a zinc sulfide film, sulfur may be charged into the center crucible 22, and zinc into the outer crucible 24. In vaporizing these elements the temperatures of the crucibles 22 and 24, vapor chamber envelope 16 and substrate S need careful control. The temperature of the center crucible 22 should be less than that of the outer crucible 24. The temperature of the vapor chamber envelope 16 should be more than that of the substrate S. The pressure in the vapor chamber is lower than that of the center crucible 22 and of the outer crucible 24. The zinc sulfide film is grown on the substrate S under the heat balance obtained as above.

Particular attention should be given to the dimensioning and positioning of the mouths 32 and 44 and neighboring parts of the crucibles 22 and 24 in the use of sulfur or like sources that develop high vapor pressures. For instance, the diameter A of the center crucible mouth 32 may be 0.5 millimeter, the width B of the outer crucible mouth 44 may be from 0.1 to 0.3 millimeter, and the length C of the outer crucible neck 40 may be at least 30 millimeters, for the best results. Should the crucible mouths 32 and 44 be larger than the above values, and should the outer crucible neck 40 be shorter than the above value, part of the sulfur vapor from the center crucible 22 would find its way into the outer crucible 24 and react with the zinc to form zinc sulfide. The desired zinc sulfide film would then not be deposited on the substrate S. This possibility can be obviated by dimensioning the pertinent parts of the crucibles 22 and 24 as above. The positioning of the outer crucible mouth 44 below the center crucible shoulder 34, as in the FIG. 1 embodiment, is also effective for the same purpose.

Second Form

FIG. 3 shows the apparatus of our invention as modified for the formation of ternary compound films. The modified apparatus, generally designated 110, features a triple crucible assembly 120 used in place of the dual crucible assembly 20 in the FIG. 1 apparatus 10, and three crucible heaters 146, 148 and 170 associated with the triple crucible assembly. The other parts of the modified apparatus 110 are constructed and arranged as in the FIG. 1 embodiment, so that we will use the same reference characters to refer, as necessary, to such parts as those used to denote the corresponding parts of the preceding embodiments.

The triple crucible assembly 120 comprises a center crucible 122, an intermediate crucible 172, and an outer crucible 124, which are arranged concentrically with respect to each other and to the tubular enelope 16 defining the vapor chamber 18. The center crucible 122 and outer crucible 124 are per se analogous in construction with the crucibles 22 and 24, respectively, of the apparatus 10. The center crucible 122 has its upper portion extending into the vapor chamber 18 and terminating in a constricted mouth 132 via a shoulder 134. The outer crucible 124 has an elongate, upstanding neck 140 bounding a mouth 144.

The intermediate crucible 172 is of tubular shape, having its upper portion received in the vapor chamber 18 and its lower portion projecting downwardly out of the vapor chamber envelope 16. The upper portion of the intermediate crucible 172 has an elongate neck 174 of a reduced diameter defining at its top end an annular mouth 176 around the center crucible 122 and having its bottom end connected to a shoulder 178. The intermediate crucible mouth 176 is positioned below the center crucible shoulder 134. The outer crucible mouth 144 is positioned below the intermediate crucible shoulder 178.

The three concentric crucibles 122, 124 and 172 have the heaters 146, 148 and 170 respectively. The intermediate crucible heater 170 is disposed intermediate the center crucible heater 146 and the outer crucible heater 148 and surrounds the bottom end portion of the intermediate crucible 172. The other details of construction are as set forth above in connection with the FIG. 1 apparatus 10.

Operation of Second Form

The operation of the second apparatus 110 is akin to that of the apparatus 10 except, of course, that three source materials M3, M4 and M5 are introduced into the respective crucibles 122, 124 and 172. Further, in heating these source materials by the crucible heaters 146, 148 and 170, we recommend that the temperature of the outer crucible 124 be higher than that of the intermediate crucible 172, and the intermediate crucible temperature higher than the temperature of the center crucible 122. Thus, for fabricating films compounded of zinc, sulfur and manganese, for instance, manganese may be charged into the outer crucible 124, zinc into the intermediate crucible 172, and sulfur into the center crucible 122.

Third Form

Figure 4:
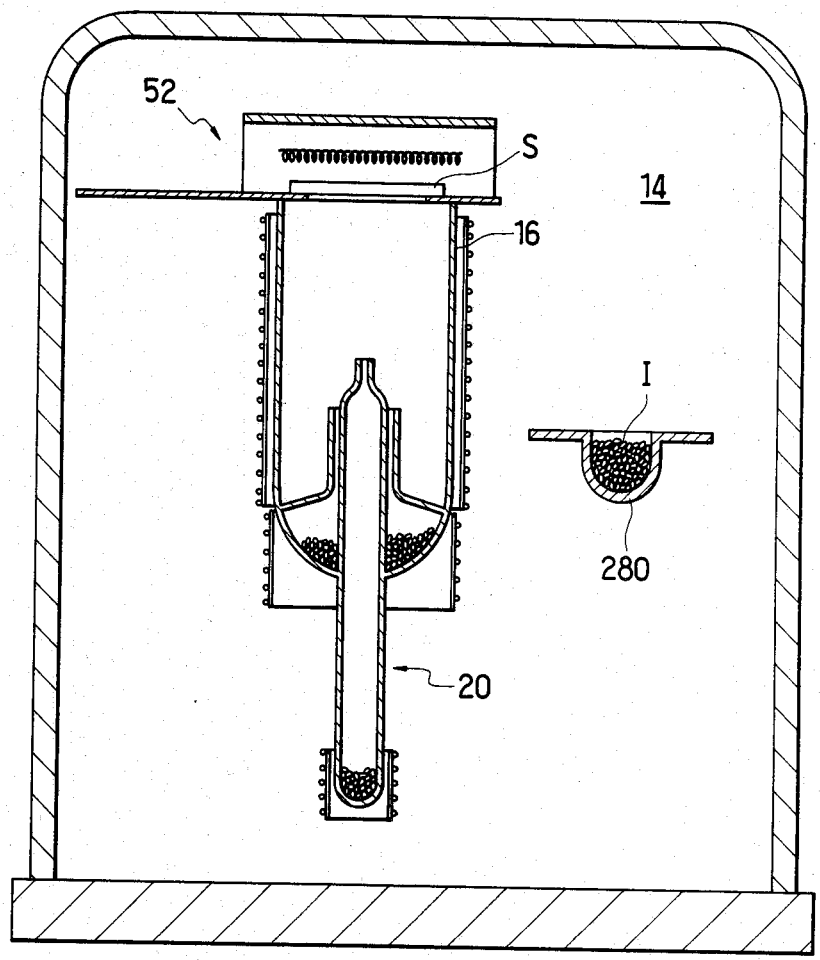
FIG. 4 is a similar view of still another preferred form of the apparatus in accordance with the invention.

In FIG. 4 is shown still another preferred form of apparatus 210 in accordance with our invention. This apparatus 210 is shown to be exactly identical with the FIG. 1 apparatus 10 except for an impurity evaporator 280 additionally mounted in the vacuum chamber 14 in side by side relation with the crucible assembly 20 and vapor chamber envelope 16. The impurity evaporator 280 contains a desired impurity source I to be evaporated.

Thus the apparatus 210 enables the formation of a compound film on the substrate S by hot wall epitaxy and the addition of an impurity to the film by vacuum evaporation. The substrate S having the compound film grown thereon on the vapor chamber envelope 16 may be moved, together with the shutter/holder combination 52, to a position over the evaporator 280. The impurity source I within the evaporator 280 may be vaporized to cause impurity deposition on the substrate. Film growth by hot wall epitaxy and that by vacuum evaporation may be repeated as required. The moments at which the substrate is moved between the two positions, as well as the film growth rate, may be suitably determined to control the addition of the impurity.

To give but one of the possible applications of the apparatus 210, a zinc sulfide film may be grown by hot wall epitaxy, and manganese may be added by vaccum evaporation.

Method

We believe that the method of our invention has been largely understood from the foregoing description. The following, then, is a more detailed discussion of an example of the inventive method as applied to the creation of a zinc sulfide film on an n type silicon epitaxial wafer substrate. The apparatus 10 of FIG. 1 may be used for the production of such a binary compound film.

1. The above substrate is first treated with hydrofluoric acid to make it clean of oxide film and other foreign matter.

2. The cleaned substrate is placed on the holder portion of the shutter/holder combination 52.

3. Zinc with a purity of 99.999% is charged into the outer crucible 24, and sulfur with a purity of 99.999% into the center crucible 22.

4. The complete vacuum chamber 14 is evacuated to, say, $10^{-6}$ torr.

Figure 2B:
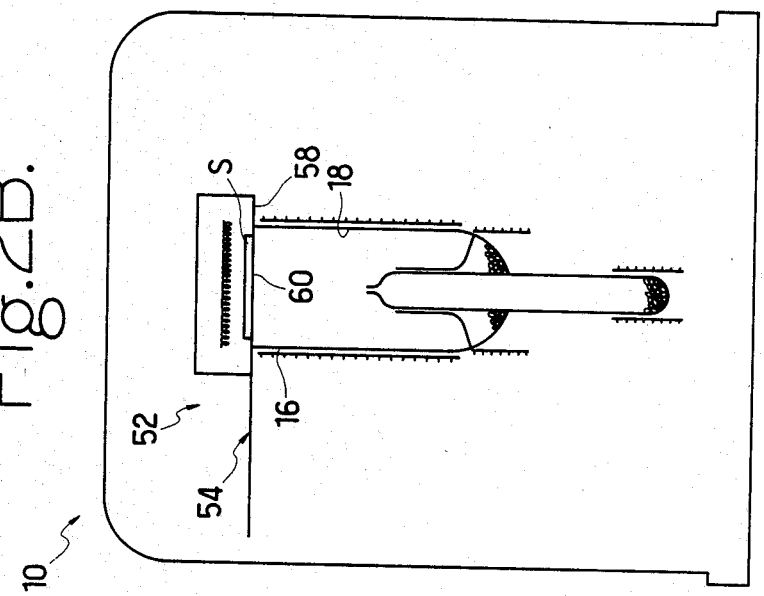
FIGS. 2A and 2B are diagrammatic vertical sections through the apparatus of FIG. 1 which are explanatory of its operation.
Figure 2A:
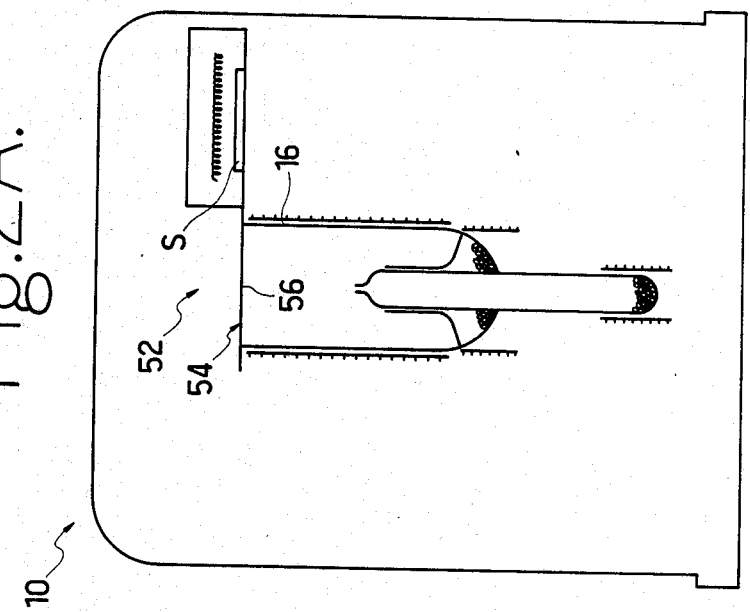

5. The open top of the vapor chamber envelope 16 is closed with the shutter portion 56 of the shutter/holder combination 52, as illustrated in FIG. 2A.

6. The zinc and sulfur within the crucibles 22 and 24 are vaporized by heating them by the heaters 46 and 48. The center crucible 22 may be heated to a temperature range from 90° to 100° C., and the outer crucible 24 to a temperature range from 400° to 450° C. Further, during the evaporation of the source materials, the vapor chamber envelope 16 and substrate S are also heated by the heaters 50 and 62, the vapor chamber envelope to a temperapture range from 450° to 500° C., and the substrate to approximately 250° C.

7. The shutter/holder combination 52 is slid over the vapor chamber envelope 16, to move the shutter portion 56 away therefrom and to bring the substrate S to the position thereover as shown in FIG. 2B, when the vapor pressure in the vapor chamber 18 rises to, say, $10^{-2}$ torr owing to the vaporization of the source materials within the crucibles 22 and 24. Thereupon a crystalline film of zinc sulfide starts growing on the substrate S. The film growth rate in this case will be approximately two micrometers per hour.

8. The shutter/holder combination 52 is slid back to the FIG. 2A position for reclosing the vapor chamber 18 with its shutter portion 56 when the zinc sulfide film is grown to a required thickness on the substrate S.

9. The heaters 46, 48, 50 and 62 are all set out of operation, and the substrate S on cooling is withdrawn from the vacuum chamber 14.

We examined the zinc sulfide films grown as above on the n type silicon epitaxial wafers by high speed electron beam reflection images. The films were of single crystals when grown to a relatively small thickness of 0.15 micrometer, and were polycrystalline when grown to a thickness of as much as 1.5 micrometers. In either case the films were of good crystallinity.

Generally the temperature of the substrate should be held as low as possible during film growth thereon in order to minimize the stoichiometric shears of the constituent atoms, to reduce strains or dislocations due to the difference in the coefficient of thermal expansion between film and substrate, and, in the case of laminar films, to prevent the interlayer diffusion of atoms. However, the lower the substrate temperature, the greater becomes the number of molecules or atoms that are not coherently bonded to the others on the substrate, although this statement must be taken in light of the fact that it depends upon the rate of film growth. We recommend the reevaporation of such loosely bonded partices for the provision of flat faced crystalline films. For this purpose the substrate on which the compound film has been grown to some extent in the vapor chamber 18 may be moved away therefrom to expose the film surface to the vacuum atmosphere. The film may be so exposed to vacuum not only once but any required number of times during its growth. Experiment has proved that this reevaporation of the loose particles from the film surface during its growth makes possible the production of very flat faced crystalline films at relatively low substrate temperatures.

Although we have shown and described our invention in very specific terms, we wish to have it understood that the invention itself is not to be restricted by such detailed disclosure. A variety of modifications or alterations will readily occur to one versed in thin film technology within the broader scope due to our invention. For instance, for fabricating laminar compound films, a required number of crucibles assemblies together with associated vapor chamber envelopes and heaters may be provided in a common vacuum chamber. The substrates may be moved from one vapor chamber to the next.

Fourth Form

Figure 5:
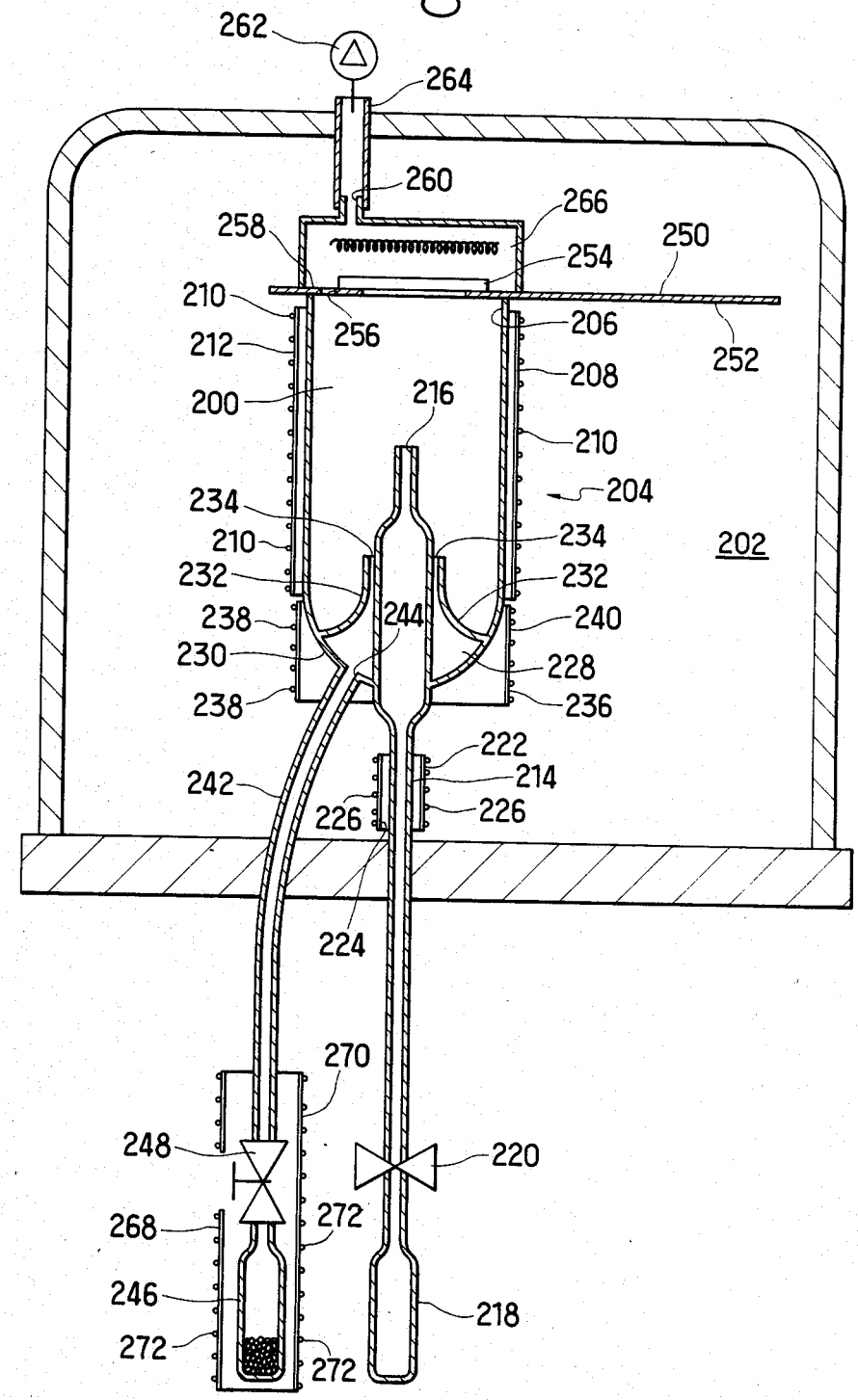
FIG. 5 is a cross sectional view of an apparatus for carrying out a method of the invention.

FIG. 5 shows a fourth embodiment of an apparatus for carrying out a method of producing crystalline compound films. This embodiment is different from the previous ones in HWE crucible, wherein source materials are introduced into a vapor chamber 200 from the outside of a vacuum chamber 202.

The numeral 204 designates HWE crucible disposed within the vacuum chamber 204. 200 is the vapor chamber having an opening 206, and other parts than the opening are completely interrupted. The vapor chamber 200 is almost of cylinder which is made of, for example, quartz glass. 208 is a heater encircling the vapor chamber with a space from the outer circumference thereof, and the heater is composed by winding a heater wire 210 such as nichrome wire, tantalum wire or the like on a quartz pipe 212.

The numeral 214 is a source material supply pipe made of e.g., quartz glass, and it extends through a bottom of the vapor chamber 200. Its upper mouth 216 is positioned about at center of the vapor chamber 200, and its lower end extends outside of the vacuum chamber 202. The source material supply pipe 214 is connected to a gas source 218 via a control valve 220.

222 is a heater constructed by winding, as mentioned above, a heater wire 226 on the quartz pipe 224 encircling the center part in the vacuum chamber 202 of the source material supply pipe 214.

228 is a heating chamber of the source material, which is defined by a bottom 230 of the vapor chamber 200 and a connecting part 232 produced with the quartz glass. The upper portion of the connecting part 232 extends with a slight space 234 from the outer circumference of the source material supply pipe 214. The space 234 is for supplying the source material, and is positioned at the center of the vapor chamber 200.

236 is a heater constructed by winding a heater wire 238 on the quartz pipe 240 encircling the source material heating chamber 228 as mentioned above.

242 is a pipe for supplying an evaporated material, and its upper end open 244 within the bottom 230 of the heating chamber 228, while its lower end extends outside of the vacuum chamber 202 and is connected to a gas source 246 via a control valve 248.

HWE crucible 204 is provided at its upper part with a substrate holder 250 as referred to in the first form. Therefore, if the substrate holder 250 is positioned just on an upper opening 206, the opening 206 is closed by a shutter portion 252 of the substrate holder 250, and on the other hand, if the substrate holder 250 is positioned outside of the upper opening 206, a substrate 254 faces to the vapor chamber 200.

256 is a hole formed in a substrate handling piece 258, and 260 is an opening provided at an upper part of the substrate holding piece 258, which is connected to an absorbing mechanism 262 via a pipe 264. An inner space 266 of the substrate handling piece 258 is interrupted from other parts except the hole 256, under a condition that the substrate 254 is provided.

Herein, a reference will be made to production of crystalline compound film to be performed by means of the above mentioned apparatus with respect to the production of ZnS film at first.

As the gas sources 218, 246, gas Bombes are used. The first gas Bombe 218 is charged with $H_2S$ gas, and the second gas Bombe 246 is charged with $ZnCl_2$. 268 is a heater enveloping the gas Bombe 246, composed of the quartz pipe 270 and the heater wire 272.

As referred to above, the upper opening 206 of the vapor chamber 200 is closed with the shutter portion 252 of the substrate holder 250. The Bombe 246 is heated by the heater 268 to evaporate the source material therein. The control valves 220 and 248 are opened, and electric conduction is made on the heater wires 210, 226 and 238 of the heaters 208, 222 and 236. Pressure Pd in the vapor chamber 200, pressure PS in the source material supply pipe 214 and pressure PZn in the source material heating chamber 228 are controlled such that interrelation is made as Pd<PZn and Pd<PS. On the other hand, temperature TW of a wall of the vapor chamber 200, temperature TS of the substrate 254, temperature $TH_1$ of the supply pipe 214 and temperature $TH_2$ of the heating chamber 228 are controlled to provide relation of TS<TW and $TH_1$<$TH_2$.

At this time, since HCl gas is generated ($ZnCl_2+H_2S \rightarrow ZnS+2HCl$), the absorbing mechanism is worked to evaporate HCl gas from the vapor chamber 200. When the subdtrate is exposed in the vacuum, the supply of the source material is stopped, and HCl gas in the inner space 266 of the substrate handling piece 258 is exhausted through the absorbing mechanism 262. Part of HCl adhering the substrate 254 is reevaporated in the vacuum.

When the crystalline compound film is produced by means of the above said apparatus, the source materials may be charged in the source material heating chamber 228. That is, ZnS film is formed by charging Zn in the heating chamber 228, and supplying Cl gas from the gas Bombe 246 to the heating chamber 228, so that $ZnCl_2$ gas is generated in the heating chamber 228.

ZnSe film is formed by using the gas Bombe filled with HSe gas as the gas source 218. At this time, $TH_1$ is set about 220° C. and $TH_2$ is set about 390° C.

What we claim is:

1. A method of producing an epitaxial crystalline film, comprising the steps of:
   (a) charging desired source materials for an epitaxial crystalline compound film into respective crucibles provided in a vapor chamber arranged in a vacuum chamber, said vapor chamber having an open top and a cover which can be opened or closed over said open top;
   (b) evacuating the vacuum chamber with the cover of said vapor chamber held open;
   (c) closing the cover of the vapor chamber to thereby close the open top of the vapor chamber and eliminate fluid communication between the vacuum chamber and the vapor chamber;
   (d) heating the vapor chamber and said crucibles provided therein so as to evaporate the source materials into the closed vapor chamber;
   (e) opening the cover of the vapor chamber and holding a substrate against the top of the vapor chamber when the vapor pressure in the vapor chamber has increased a predetermined degree, so that the crystalline compound film is caused to grow on the substrate;
   (f) stopping the growth of the crystalline compound film by moving the substrate away from over the vapor chamber and exposing the film to vacuum in the vacuum chamber, thereby causing re-evaporation of any loosely bonded atoms or molecules of said source material therefrom; and,
   (g) moving the substrate to the top of the vapor chamber to continue the epitaxial growth of the crystalline compound film of said source material thereon.

2. A method according to claim 1 comprising separately heating said substrate at the same time said vacuum chamber and said crucibles are heated.

3. A method according to claim 1 wherein, in step (d), a pressure is developed within said vapor chamber which is substantially greater than the pressure within said vacuum chamber.

4. A method according to claim 1 wherein, in step (d), evaporated source material is fed from its respective crucible into said vapor chamber through a narrow passageway.

5. A method of producing an epitaxial crystalline compound film, comprising the steps of:
   (a) charging desired source materials for an epitaxial crystalline compound film into respective crucibles provided in a vapor chamber arranged in a vacuum chamber, said vapor chamber having an open top and a cover which can be opened or closed over said open top;
   (b) evacuating the vacuum chamber with the cover of said vapor chamber kept open;
   (c) closing the cover of the vapor chamber to thereby close the open top of said vapor chamber and eliminate fluid communication between the vacuum chamber and the vapor chamber;
   (d) heating the vapor chamber and the crucibles provided therein so as to evaporate the source materials into the closed vapor chamber;
   (e) opening said cover of the vapor chamber and holding a substrate against the top of the vapor chamber when the vapor pressure in the vapor chamber has increased a predetermined degree, so that the crystalline compound film is caused to grow on the substrate;
   (f) stopping the growth of the crystalline compound film by moving the substrate, with the crystalline compound film grown thereon, away from over the vapor chamber to another position in said vacuum chamber and thereby exposing the film to vacuum in the vacuum chamber, thereby causing re-evaporation of any loosely bonded atoms or molecules of said source material therefrom; and
   (g) adding an impurity to the grown crystalline compound film on the substrate by evaporating an impurity source into said vacuum chamber.

6. A method according to claim 5 comprising separately heating said substrate at the same time said vacuum chamber and said crucibles are heated.

7. A method according to claim 5 wherein, in step (d), a pressure is developed within said vapor chamber which is substantially greater than the pressure within said vacuum chamber.

8. A method according to claim 5 wherein, in step (d) evaporated source material is fed from its respective crucible into said vapor chamber through a narrow passageway.

* * * * *